(12) United States Patent
Harris

(10) Patent No.: US 6,301,578 B1
(45) Date of Patent: Oct. 9, 2001

(54) METHOD OF COMPRESSING INTEGRATED CIRCUIT SIMULATION DATA

(75) Inventor: Mark Harris, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/015,298

(22) Filed: Jan. 29, 1998

(51) Int. Cl.[7] .................................................. G06F 9/00
(52) U.S. Cl. ........................................ 707/101; 707/205
(58) Field of Search ............................................ 707/1–206

(56) References Cited

U.S. PATENT DOCUMENTS

| | | | |
|---|---|---|---|
| 5,258,932 | 11/1993 | Matsuzaki | 703/15 |
| 5,345,450 | 9/1994 | Saw et al. | 714/741 |
| 5,532,717 | 7/1996 | Jones et al. | 345/555 |
| 5,535,008 | * 7/1996 | Yamagishi et al. | 358/342 |
| 5,778,339 | * 7/1998 | Sonohara et al. | 704/224 |
| 6,016,382 | * 1/2000 | Yamagishi et al. | 386/109 |

* cited by examiner

Primary Examiner—Thomas Black
Assistant Examiner—John G. Mills
(74) Attorney, Agent, or Firm—Law Offices of Terry McHugh

(57) ABSTRACT

A method of compressing a block of time series data involves sorting the data by variable name, separating the series of time values from the series of variable values, and performing data extraction and/or compression independently on the series of time values and on the series of variable values. The reduced volume of data is then written to a database. In a preferred embodiment, the time series of data represents data generated from a computer simulation of an integrated circuit. In order to efficiently compress the time series data, individual blocks of time series data representing a particular time range are sorted by variable name, with each variable name having associated time values and variable values. The time values and variable values are separated into two distinct data sets, and data compression is performed separately on the two distinct data sets. The compressed information related to each individual variable is then stored in individual variable blocks. The individual variable blocks can be further compressed into time slice blocks before writing to a database. Compressing distinct time value and variable value data sets allows greater pattern recognition and higher compression ratios.

25 Claims, 6 Drawing Sheets

METHOD OF COMPRESSING INTEGRATED CIRCUIT SIMULATION DATA

TECHNICAL FIELD

The invention relates generally to managing the data generated from a computer simulation of an integrated circuit (IC) and more particularly to a technique for compressing the data that is generated from a computer simulation of an IC.

BACKGROUND ART

Referring to FIG. 1, a computer simulation 10 of an IC involves measuring inputs and outputs at various signal points within the IC to simulate operation of the IC. In the example of FIG. 1, there are four input points 22, 24, 26 and 28 and three output points 32, 34 and 36 schematically representing a specific portion of an IC. During the simulation, data is read from the designated points and the data is recorded in relationship to time. Data recorded in relation to time is referred to as time series data. Referring to FIG. 2, in computer simulations, time series data 40 represents electrical waveforms and typically consists of a variable name 42, a time value 44, and a variable value 46. The variable name corresponds to the point within the simulation that is being monitored, the time value represents the time that the sample was taken from the named variable, and the variable value represents the result of the monitoring at the specific named variable at the specific time.

FIG. 3 is a depiction of an example block of time series data 50 generated from the simulation 10 of FIG. 1 taken over nine time periods, The four input points or input variables 22–28 and the three output points or output variables 32–36 are identified at the top row 52 of the matrix, and the time values t0 through t8 are identified at the leftmost column 54 of the matrix. The variable values are identified at the intersection of each row and column. In some cases the variable value is representative of a transition from one state to another, with the transition being represented by the change from "0" to "1" or "1" to "0".

In an actual computer simulation, there may be thousands, if not millions, of variables being measured at rates that are small fractions of a second. The net result is that the amount of data generated by computer simulations is extremely large, for example, in excess of ten thousand megabytes per simulation.

Storing such large amounts of simulation data in their entirety is inefficient and often impractical. In order to more efficiently store and manage such large quantities of data, techniques have been developed to compress simulation data into smaller quantities. One prior art technique for compressing simulation data is disclosed in U.S. Pat. No. 5,345,450, entitled "Method of Compressing and Decompressing Simulation Data for Generating a Test Program for Testing a Logic Device," issued to Saw et al. (hereinafter Saw). Saw discloses a technique that reduces the number of input values in a sequence of input values when the sequence includes a series of redundant input values that are expected to generate the same output values. For example, referring to FIG. 3, Saw identifies the redundant input values that are represented at times t4 through t7 and eliminates all but the first input value at t4. Saw then encodes a group of control bits associated with the remaining input value, with information indicating the number of redundant input values being eliminated. The smaller set of input values produces a smaller set of output values and a smaller overall data set for the simulation results. The results can then be expanded to recover the eliminated data.

Although Saw works well for its intended purpose, as simulation complexity continues to grow, there is still a need for improved compression techniques that increase the amount of simulation data that can be stored in a limited storage space.

SUMMARY OF THE INVENTION

A method of compressing a block of time series data involves sorting the data by variable name, separating the series of time values from the series of variable values, and performing data pattern extraction and/or compression independently on the series of time values and on the series of variable values. The reduced volume of data is then written to memory, preferably in a database format.

In a preferred embodiment, the time series of data is generated from a computer simulation of an integrated circuit (IC). The computer simulation generates large volumes of time series data in a sequential manner. In order to efficiently compress the time series data, individual blocks of time series data representing a particular sequential time range are sorted by variable name, with each variable name having associated time values and variable values. The time values and variable values are separated into distinct data sets, and data pattern extraction, which is one type of data compression, is performed separately on the two distinct data sets. The compressed information related to each individual variable is then stored in an individual variable block. The time values and the variable values are stored within the variable blocks in a time sequential manner.

Each individual Variable Block includes a Variable Block Header that identifies the variable name, a Times Block, and a Values Block. The Times Block contains a Times Block Header that identifies the compression algorithm used on the times values and a Compressed Times Block that contains the compressed times data. The Values Block contains a Values Block Header that identifies the compression algorithm used on the variable values and a Compressed Values Block that contains the compressed values data. The Variable Blocks are stored in a memory buffer until a designated quantity of data is accumulated.

Upon reaching the designated quantity, the variable blocks are again compressed into Time Slice Blocks (TSBs). A single TSB contains all of the Variable Blocks generated in a particular range of time. Each TSB is comprised of a Transitions component, a Transitions Index, a Compression Information component, and a Header. The Transitions component of the TSB contains the Variable Blocks for a set of variables within a particular time range. The Transitions Index contains an index that identifies the start and end locations of each Variable Block stored within the Transitions component. The Compression Information component of the TSB contains translation lookup tables for decoding the compression techniques or algorithms used to compress the Variable Blocks. The Header component of a TSB contains information including the time range that is represented in the TSB and the location of the next TSB. Once TSBs are generated, the TSBs are written to the database in a time sequential manner and are stored in contiguous locations within the database.

Although the preferred embodiment describes compression processes when filling the RAM buffer and when writing to the database, it is not necessary that compression be performed at each point. Because the time series data is sorted into time values and variable values, compression can optionally be performed only once at either point in the operation.

In an alternative embodiment, the process of writing data to the database can be controlled such that a maximum database file size is not exceeded. When the maximum file size is reached, the newest data being written to the database is written over the oldest data that is resident in the database. The old data is overwritten because the newest data is considered more valuable than the old data.

An advantage of the invention is that breaking down the time series data into time values and variable values provides a greater opportunity to exploit inherent recurring patterns in the time value data and the variable value data. Storing time series data in Variable Blocks allows for quick access to the data related to a single variable for a particular time range because all of the data for a given variable for some range of time is in a single variable block within each Time Slice Block. Storing time series data in Time Slice Blocks allows for quicker data access to a group of variables because all of the variable values for the group of variables within a specified time range are stored together in one area of the database. Implementing the option to overwrite old data provides the advantage that all of the data from the most recent time ranges are preserved.

DETAILED DESCRIPTION

Figure 4:
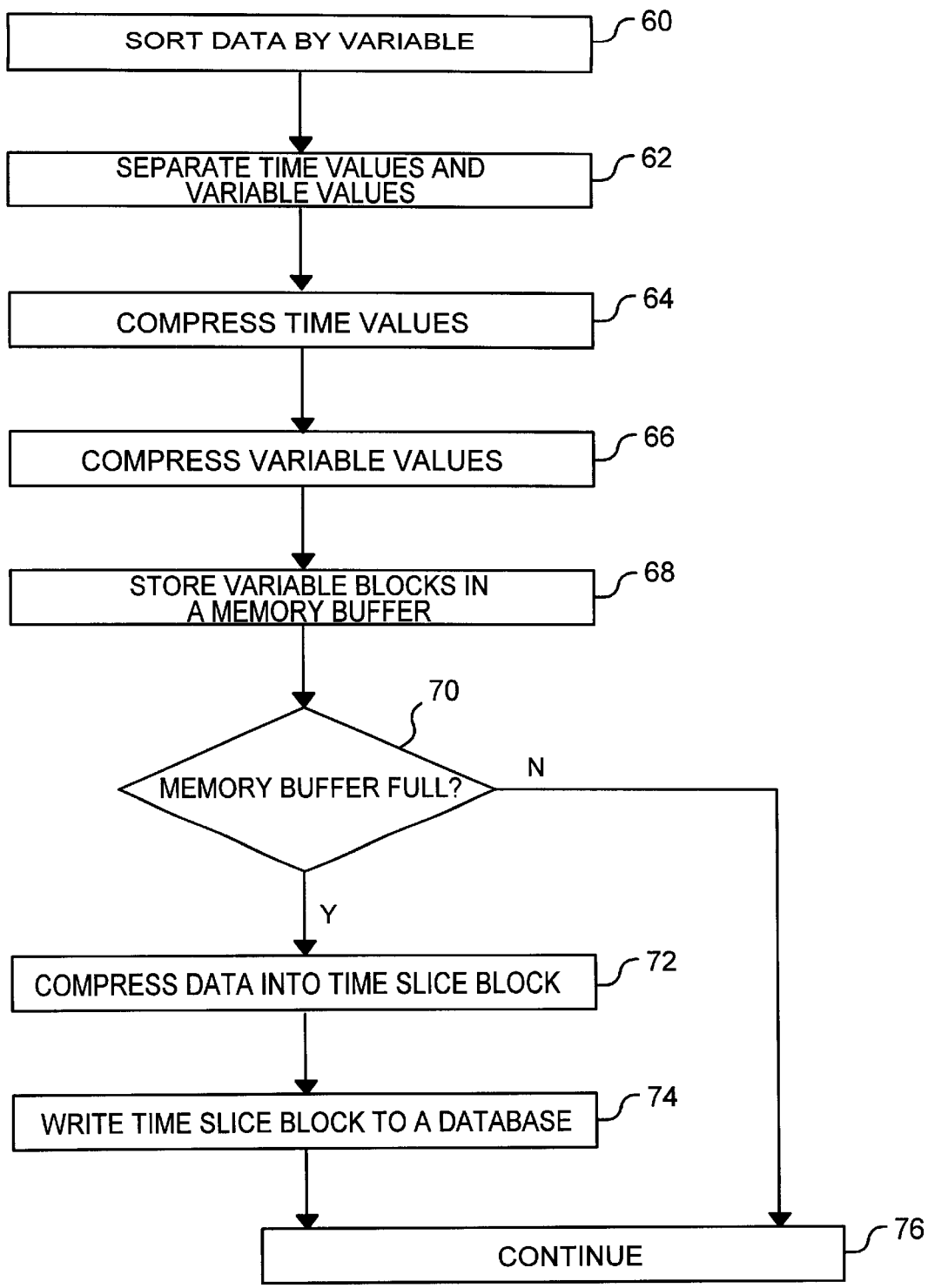
FIG. 4 is a process flow diagram for storing time series data in a database in accordance with the invention.

The preferred method for compressing and storing simulation data into a database is depicted in the flow diagram of FIG. 4, and is described in detail on an item-by-item basis.

Figures 1, 2:
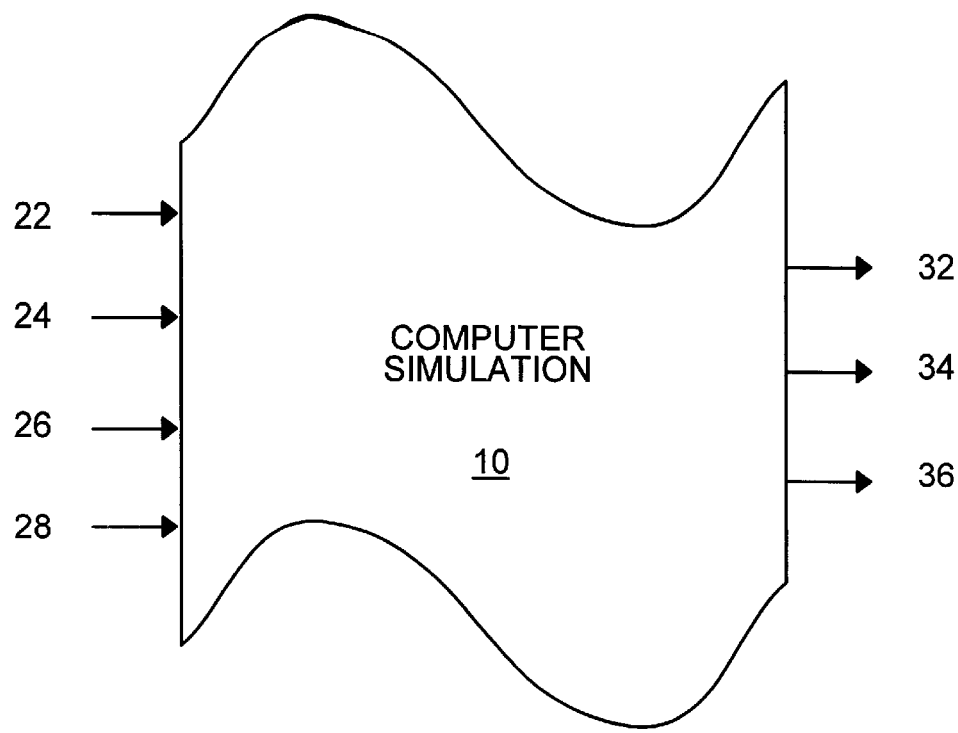
FIG. 1 is a schematic representation of a computer simulation including four input variables and three output variables as known in the prior art.
FIG. 2 is a schematic representation of the format of time series data as known in the prior art.
Figure 3:
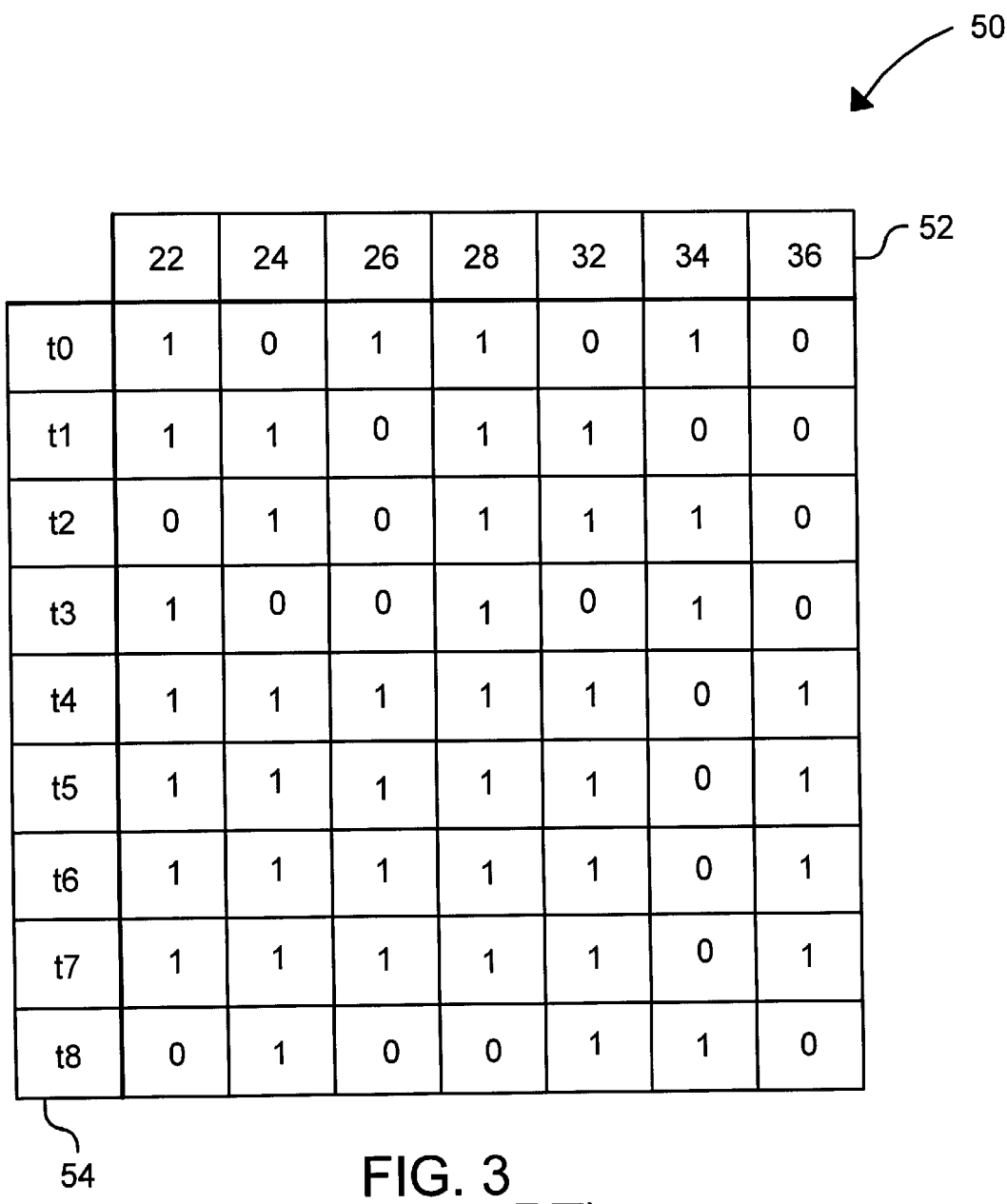
FIG. 3 illustrates, as an example, a block of time series data resulting from the computer simulation schematically illustrated in FIG. 1.
Figure 5:
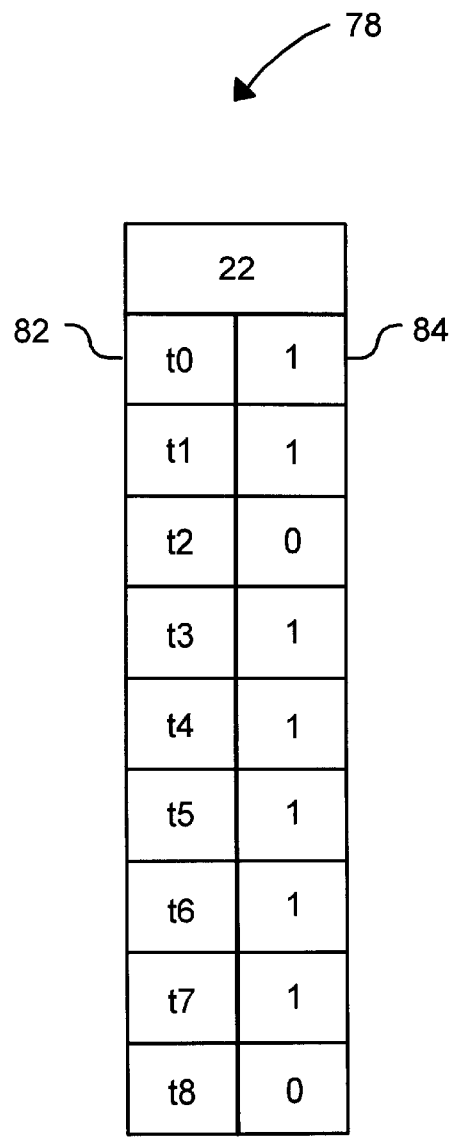
FIG. 5 is a single Variable Block of time series data extracted from FIG. 3.

The first step 60 in the method involves sorting a block of time series data, such as the data presented in FIG. 3, by variable name over a particular specified period of time. FIG. 5 represents one block 78 of data for the variable 22 that has been sorted from the series. The block of data contains the time values 82 for times t0 through t8 and the corresponding variable values 84. As a result of sorting the entire block of time series data, seven blocks of data are generated and all of the seven blocks have corresponding time values t0 through t8 and corresponding variable values at times t0 through t8. It should be noted that time values are not typically stored as absolute time values but are usually measured and stored as the change in time between sampling events.

The next step 62 in the method involves separating the variable name, the time values, and the variable values for each variable. For example, referring to FIG. 6, the variable name 90 is separated from the time values 92 and variable values 94, and the time values (t0 through t8) are separated from the corresponding variable values (1, 1, 0, 1, 1, 1, 1, 1, 0) into separate time value and variable value data sets. Separating the related time value and variable value data sets creates two data sets that have only one degree of freedom (time value or variable value), instead of maintaining one data set that has two degrees of freedom (time value and variable value).

Referring to FIG. 4, the next two steps 64 and 66 in the method involve compressing the data sets of time values 92 and variable values 94 for each variable. Preferably, compression is achieved by performing separate pattern extraction functions on the time value data set and the variable value data set. Pattern extraction involves looking at the particular data pattern to determine if patterns reoccur in the data, and then using coded shortcuts to identify the recurring data patterns. For example, the variable values 94 presented in FIG. 6 contain a series of five "1"s, one after the other. Instead of storing data representing five "1"s, a pattern extraction algorithm may be able to economize the data set. Because the time values and the variable values are examined separately and have only one degree of freedom, it is more likely that extractable data patterns will occur. The pattern extraction techniques used to compress the data sets can be selected from a variety of compression techniques as needed to provide the most efficient data set reduction.

Figure 7:
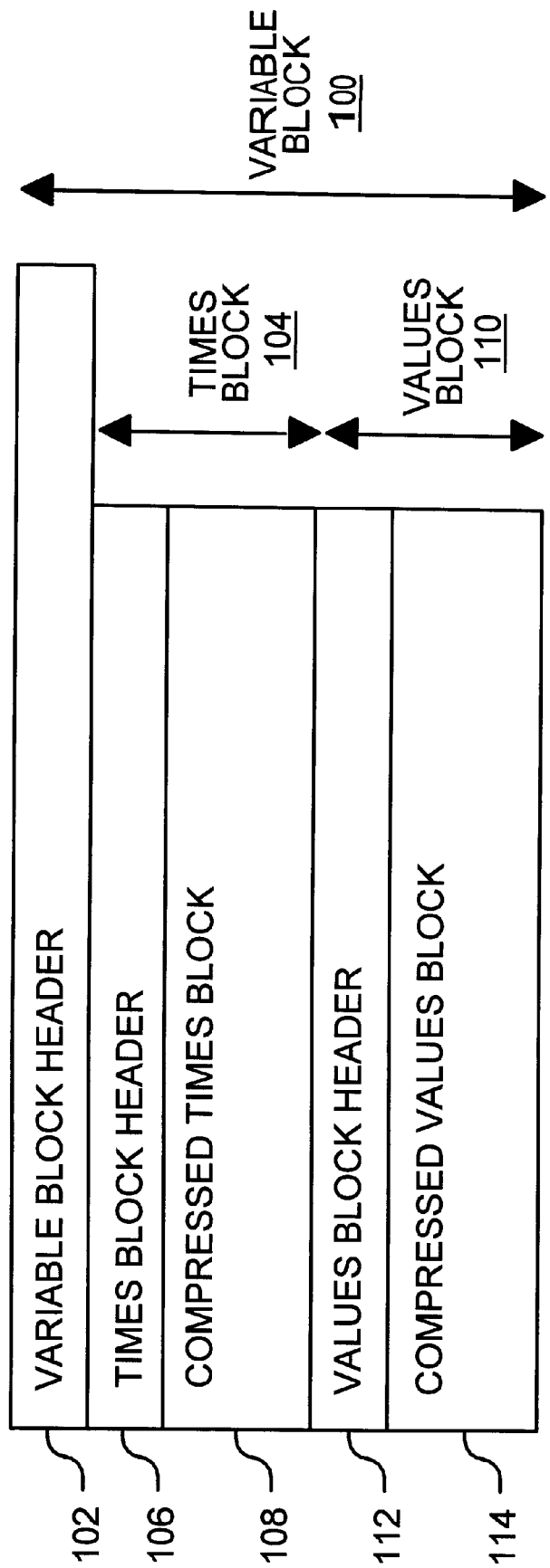
FIG. 7 is a schematic representation of the format of a single Variable Block in accordance with the invention.

The individually extracted and compressed data for a particular variable over a particular time range is stored in a time sequential manner in a Variable Block 100 using the format depicted in FIG. 7. The first component of the Variable Block is the Variable Block Header 102, which contains the variable name. The second component of the Variable Block is the Times Block 104. The Times Block contains the Times Block Header 106, which identifies the compression algorithms applied to the time values, and the Compressed Times Block 108, which contains the compressed time values. In the preferred embodiment, the time values are stored as the change in time from the previous sample. The third component of the Variable Block is the Values Block 110. The Values Block contains the Values Block Header 112, which identifies the compression algorithms applied to the variable values, and the Compression Values Block 114, which contains the compressed variable values. In the preferred embodiment, the most important parts of a series of variable values are the transitions, yet the initial value for each variable block is stored regardless of whether or not a transition has occurred. An individual Variable Block is generated for each variable over the specified time period. In the example of FIG. 3, for the time range from t0 through t8, seven individual Variable Blocks are generated, one for each of the variables 22, 24, 26, 28, 32, 34 and 36.

Again referring to FIG. 4, the next step in the method involves storing the Variable Blocks in a memory buffer. The memory buffer is preferably a RAM buffer, and while in this embodiment the time series data is stored in the buffer after the pattern extraction, the simulation data may alternatively be stored in the buffer with no compression and subsequently compressed while being written out to the Time Slice Blocks. At decision point 70, the storage level of the buffer is continually monitored and, if the buffer capacity is not exceeded, the buffer continues 76 to receive time series data.

When the buffer has reached its capacity, the next step 72 in the method involves compressing a set of Variable Blocks, from the same time range, into Time Slice Blocks (TSBs).

Any applicable compression technique can be selected to compress the Variable Blocks into TSBs, and in a preferred embodiment, the compression technique utilizes Huffman encoding. In the compression process, the initial value of each variable is stored in the TSBs regardless of whether or not a transition has occurred.

Figure 8:
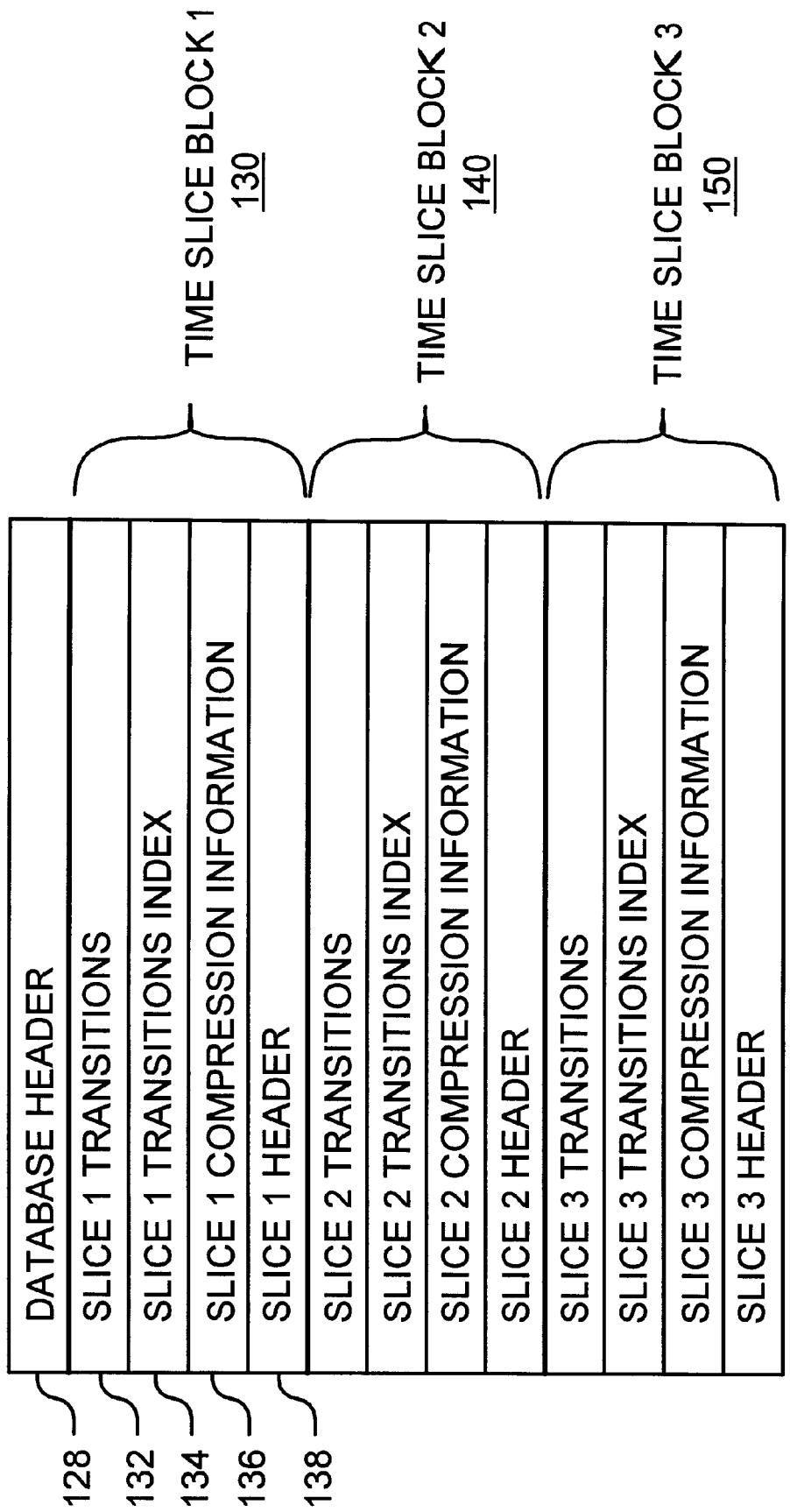
FIG. 8 is a schematic representation of three sequential Time Slice Blocks in accordance with the invention.

FIG. 8 is a block diagram of a series of three TSBs 130, 140, and 150 stored in a database. The database has a Header 128 that identifies the TSB locations within the database. Each TSB contains the time values and variable values for a set of variables over a discrete time range. For example, TSB 1, 130, is comprised of a Transitions 132 component, a Transitions Index 134, a Compression Information 136 component, and a Header 138. The Transitions component of a TSB contains the Variable Blocks for a set of variables within a particular time range. As an example, the Transition component of a single TSB may contain upwards of ten thousand Variable Blocks. The Transitions Index contains an index that identifies the start and end locations of each Variable Block stored within the Transitions component. The Transitions Index is rapidly searchable, thereby allowing quick access to the individual Variable Blocks. The Compression Information component of the TSB contains translation lookup tables for the decoding of the compression techniques, or algorithms, used to compress the Variable Blocks. Alternatively, the Compression Information component may identify the compression algorithms used. The Header component of a TSB contains information including the time range that is represented in the TSB and the location of the next TSB. With respect to the time range of the TSB, the Header preferably identifies the start and end times of the TSB time range.

Again referring to FIG. 4, the next step 74 in the method involves writing the TSBs to a database. In a preferred embodiment, the TSBs are written to the database each time the RAM buffer reaches its storage capacity. In addition, in the preferred embodiment, the TSBs are stored sequentially in a contiguous memory, such as a magnetic disk. Storing TSBs together in a contiguous format enables TSBs to be located and retrieved in less time than if the TSBs are scattered in different locations of the database. The process of compressing the Variable Blocks into TSBs is continued 76 each time the memory buffer reaches capacity. Subsequent TSBs are stored sequentially in contiguous memory.

Figure 6:
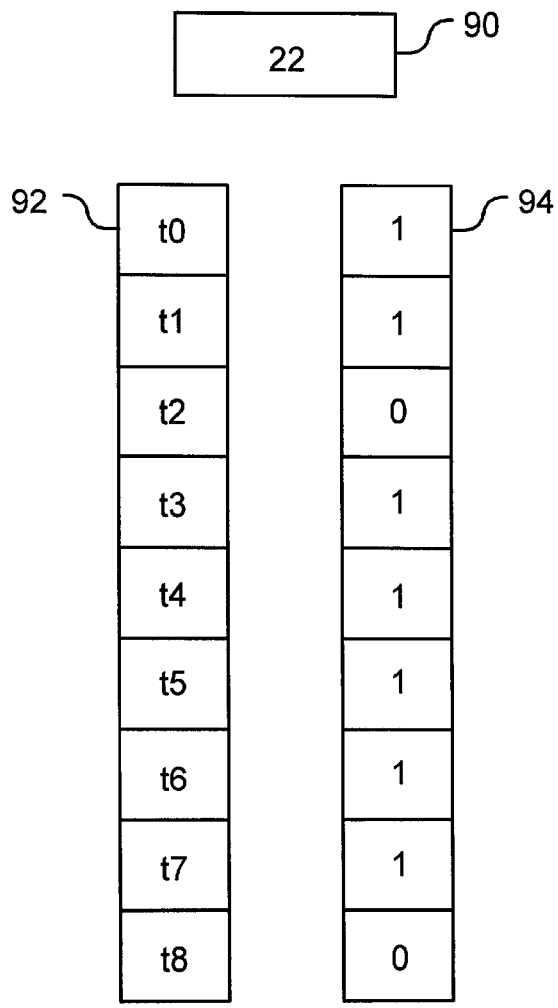
FIG. 6 is the single Variable Block of FIG. 5 sorted into three distinct components in accordance with the invention.

Although the preferred embodiment describes two data compression processes, it is not necessary that both processes occur in every instance. In fact, as long as the time series data is sorted 60 by variable and separated 62 into time values 92 and variable values 94 as depicted in FIG. 6, the time series of data can be compressed in any manner and at any point before writing to memory.

In an alternative embodiment, the process of writing data to the database can be controlled such that a maximum database file size is not exceeded. For example, a maximum file size of one gigabyte can be established for storing compressed time series data in the database. When the maximum file size is reached, the newest data being written to the database is written over the oldest data that is resident in the database. A one-word pointer in a database index indicates the location of the oldest time series data stored in the database. The TSBs constitute a linked list with each TSB containing a pointer that indicates the location of the next sequential TSB.

The compression of time series data can be performed on Unix or Windows based computer systems, and the method is preferably developed in C++ using conventional computer programming techniques. The compression method is applicable to most IC simulators, including Verilog, VHDL, and cycle-based simulators.

In another alternative embodiment, the Variable Blocks and/or the TSBs may contain data that does not completely fill the designated time range, or the Variable Blocks and/or TSBs may contain data that is slightly outside of the designated time range. Allowing slight deviations of data stored in the time ranges allows the database to account for slight timing irregularities in the computer simulation.

Although the invention has been described with reference to time series data generated from a computer simulation of an IC, the invention applies equally to time series data generated from other sources and the full scope of the invention is determined by the appended claims.

What is claimed is:

1. A method of compressing time series data comprising the steps of:

identifying a plurality of variables for which variable values as a function of time are desired;

acquiring variable values which are specific to said variables, including forming time series data for said plurality of variables, said time series data being representative of associations between said variable values and time values, wherein content of said time series data is formatted such that each said variable value is identifiable with said variable to which said variable value is specific;

sorting said time series data on a basis of said variables, thereby providing a plurality of sorted variables;

separating said time series data, for each of said plurality of sorted variables, into a distinct series of time values and a distinct series of variable values;

compressing said series of time values separate from said series of variable values for each of said plurality of variables;

compressing said series of variable values separate from said series of time values for each of said plurality of variables; and writing said compressed series of time values and said compressed series of variable values to a memory for each of said plurality of variables.

2. The method of claim 1 wherein said step of compressing said series of time values includes a substep of extracting time value data patterns from said series of time values.

3. The method of claim 1 wherein said step of compressing said series of variable values includes a substep of extracting variable value data patterns from said series of variable values.

4. The method of claim 1 wherein said step of writing includes writing said compressed series of time values and said compressed series of variable values to contiguous memory locations within said memory.

5. The method of claim 1 wherein said step of acquiring said variable values includes generating said time series data from a computer simulation of an integrated circuit.

6. The method of claim 1 wherein said step of writing includes generating an index indicative of database locations of said compressed data for said plurality of variables.

7. The method of claim 1 wherein said step of compressing said series of variable values includes compressing an initial variable value and compressing subsequent variable value transitions.

8. The method of claim 1 wherein said step of writing said compressed series of time values and said compressed series of variable values includes an initial step of combining said time value and variable value data into a corresponding plurality of variable blocks, said plurality of variable blocks corresponding on a one-to-one basis to said plurality of variables.

9. The method of claim 1 wherein said step of compressing said series of time values includes generating an indicator of a compression technique used to compress said series of time values.

10. The method of claim 1 wherein said step of compressing said series of variable values includes generating an indicator of a compression technique used to compress said series of variable values.

11. The method of claim 1 wherein said step of writing includes writing said compressed series of time values and said compressed series of variable values into time slice blocks that correspond to a particular time range.

12. A method of electronically compressing time series data generated from a computer simulation of an integrated circuit, said time series data consisting of a plurality of variables having a series of time values and corresponding variable values, comprising the steps of;
receiving time series data from a computer simulation of an integrated circuit;
sorting said time series data by variable;
separating said time series data into a time value data set containing time values and a variable value data set containing variable values, respectively, for each of said plurality of variables;
compressing said time value data set for each of said plurality of variables;
compressing said variable value data set for each of said plurality of variables; and
writing said compressed time value data sets and said compressed variable value data sets to a database.

13. The method of claim 12 wherein said step of compressing said time value data set includes a substep of selecting a compression technique from a plurality of compression techniques for each of said plurality of variables.

14. The method of claim 12 wherein said step of compressing said variable value data set includes selecting a compression technique from a plurality of compression techniques for each of said plurality of variables.

15. The method of claim 12 wherein said step of writing said compressed time value data sets and said compressed variable value data sets to a database includes writing said data sets to a contiguous memory within said database.

16. The method of claim 12 wherein said step of sorting said time series data set includes a step of storing an initial variable value for each variable.

17. The method of claim 12 wherein said step of writing to a database includes writing said compressed time value data sets and said compressed variable value data sets into a time slice block.

18. The method of claim 12 wherein said step of writing said compressed time value data sets and variable value data sets includes an initial step of combining a corresponding time value and variable value data set into a corresponding variable block for each variable.

19. The method of claim 18 wherein said step of combining includes a substep of generating an indicator of a compression technique used to compress said time value and variable data sets.

20. The method of claim 18 wherein said step of combining includes a substep of generating a variable block header, a times block header, a compressed times block, a values block header, and a compressed values block.

21. The method of claim 18 wherein said step of writing includes a subsequent step of writing said plurality of variable blocks into a time slice block.

22. The method of claim 21 wherein said step of writing said plurality of variable blocks into said time slice block includes a step of generating an index indicating where each of said variable blocks begins and ends.

23. The method of claim 21 wherein said step of writing said plurality of variable blocks into said time slice block includes a substep of generating a transitions component, a transitions index, a compression information component, and a header.

24. The method of claim 18 wherein said step of combining includes a subsequent step of compressing said plurality of variable blocks into a time slice block.

25. A method of compressing time series data comprising the steps of:
receiving time series data in a format in which content of said time series data is indicative of a plurality of variables and associations between each said variable with both sequences of variable values and time values that are identifiable with said variable values;
sorting said time series data on the basis of said variables to provide segments of said time series data;
separating said segments of said time series data, for each of said plurality of sorted variables, into a distinct series of time values and a distinct series of variable values;
compressing said series of time values separate from said series of variable values for each of said plurality of variables;
compressing said series of variable values separate from said series of time values for each of said plurality of variables;
storing said compressed series of time values and said compressed series of variable values in a memory buffer for each of said plurality of variables; and
writing said compressed series of time values and said compressed series of variable values to a memory for each of said plurality of variables.

* * * * *